(12) United States Patent
Wang

(10) Patent No.: US 7,078,283 B1
(45) Date of Patent: Jul. 18, 2006

(54) PROCESS FOR PROVIDING ESD PROTECTION BY USING CONTACT ETCH MODULE

(75) Inventor: Ling-Sung Wang, Hsin-chu (TW)

(73) Assignee: Taiwan Semiconductor Manufacturing Company (TW)

( * ) Notice: Subject to any disclaimer, the term of this patent is extended or adjusted under 35 U.S.C. 154(b) by 225 days.

(21) Appl. No.: 10/213,586

(22) Filed: Aug. 7, 2002

(51) Int. Cl.
*H01L 21/336* (2006.01)
*H01L 29/72* (2006.01)

(52) U.S. Cl. .................. 438/197; 438/237; 257/173
(58) Field of Classification Search .......... 257/173, 257/328, 355, 356, 357, 358, 359, 360, 361, 257/362, 363, 388, 412, 413; 438/197, 237, 438/309, 585, 587, 588, 592
See application file for complete search history.

(56) References Cited

U.S. PATENT DOCUMENTS

| | | | | |
|---|---|---|---|---|
| 4,376,672 A | * | 3/1983 | Wang et al. | 438/713 |
| 5,324,673 A | * | 6/1994 | Fitch et al. | 438/156 |
| 5,618,740 A | | 4/1997 | Huang | 438/224 |
| 5,619,072 A | * | 4/1997 | Mehta | 257/774 |
| 5,891,792 A | | 4/1999 | Shih et al. | 138/525 |
| 5,929,490 A | * | 7/1999 | Onishi | 257/347 |
| 5,939,753 A | * | 8/1999 | Ma et al. | 257/339 |
| 5,953,601 A | | 9/1999 | Shiue et al. | 438/200 |
| 6,075,271 A | * | 6/2000 | Smith | 257/355 |
| 6,110,771 A | * | 8/2000 | Ahn | 438/200 |
| 6,184,129 B1 | * | 2/2001 | Hwang et al. | 438/653 |
| 6,194,128 B1 | * | 2/2001 | Tao et al. | 438/637 |
| 6,242,297 B1 | * | 6/2001 | Ishigaki | 438/238 |
| 6,258,672 B1 | | 7/2001 | Shih et al. | 438/275 |
| 6,365,941 B1 | * | 4/2002 | Rhee | 257/357 |

FOREIGN PATENT DOCUMENTS

TW         91104749          3/2002

* cited by examiner

*Primary Examiner*—Douglas W Owens
(74) *Attorney, Agent, or Firm*—Duane Morris LLP

(57) ABSTRACT

A new process is provided for the creation of an ESD protection circuit. The invention starts with a first conventional gate electrode and a second gate electrode that is designated as being the gate electrode that provides the ESD protection function. The contact surfaces of the first and second gate electrode are salicided, an etch stop layer is deposited which serves as an etch stop for the creation of contact openings to the contact surfaces of the second gate electrodes. The etch stop layer is removed from the surface of the source/drain regions of the second (that is the ESD) gate electrode. A layer of dielectric is deposited over the first and the second gate electrodes, contact openings are created through the layer of dielectric to the source/drain contact surfaces of the first and second gate electrodes. Significantly, an overetch into the source/drain regions of the second (the ESD) gate electrode occurs during this contact etch. The contact openings are filled with a metal. The contact interconnects into the source/drain regions of the ESD gate electrode provide a low-resistivity leakage path from the contact interconnect through the source/drain regions into the substrate on the surface of which the gate electrodes have been created. This low-resistivity leakage path is the ESD protection path of the invention.

59 Claims, 5 Drawing Sheets

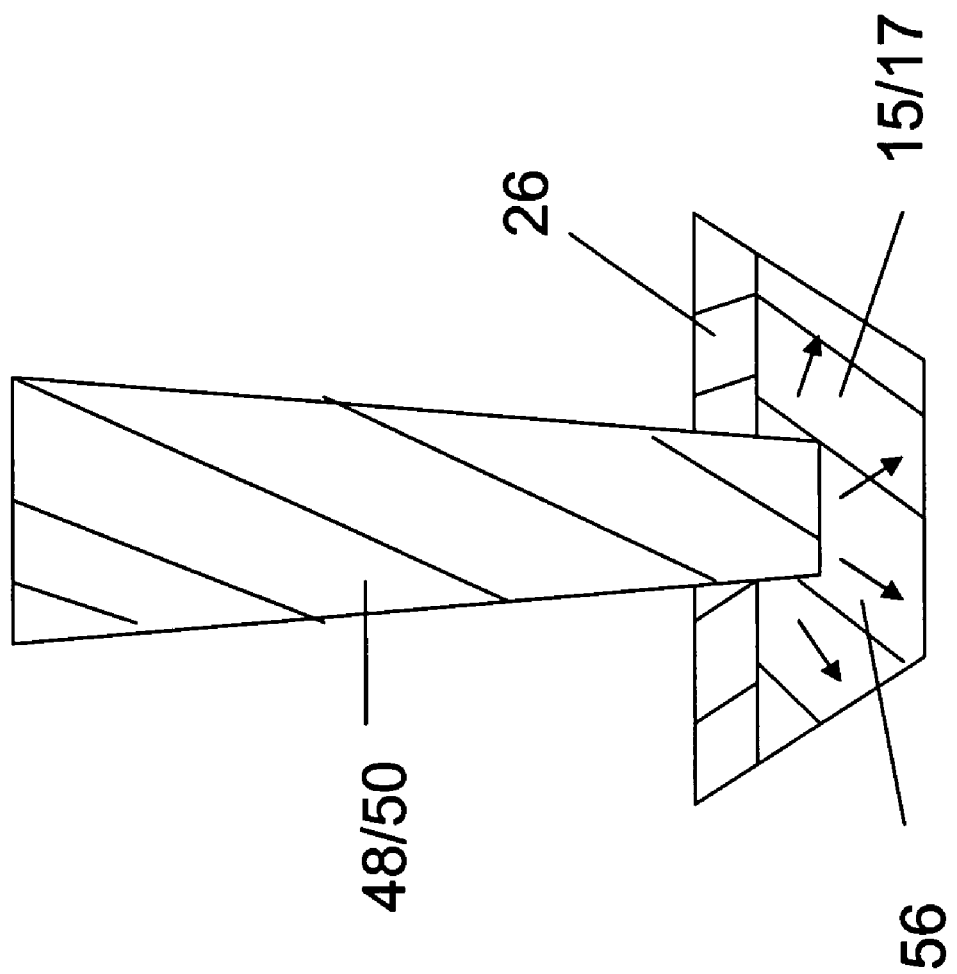

PROCESS FOR PROVIDING ESD PROTECTION BY USING CONTACT ETCH MODULE

BACKGROUND OF THE INVENTION (1) Field of the Invention

The invention relates to the fabrication of integrated circuit devices, and more particularly, to a method and structure for providing ESD protection.

(2) Description of the Prior Art

One of the undesired side-effects of creating semiconductor devices is the accumulation of an electromagnetic charge, which can essentially occur at difficult to predict locations and which can randomly discharge. This random electrostatic discharge (referred to as ESD) is typically uncontrolled in its origin and in its occurrence and is prone to damage one or more of the elements that are part of a semiconductor device. The most likely source of the accumulation of electrostatic voltage is the frictional rubbing together of adjacent surfaces or bodies. Another source that is prone to create ESD is lightning, which can randomly distribute electrostatic voltage throughout an affected semiconductor device, thus damaging for instance thin layers of dielectric or causing junction breakdown in for instance Field Effect Transistors (FET). With increased device miniaturization it is reasonable to expect that ever smaller device features are becoming even more prone to device damage caused by ESD since ESD will have a relatively larger effect on smaller and thinner device features.

High-density semiconductor devices such as multi-chip modules and other electronic devices are typically created using unpackaged semiconductor devices. The functions of electrically contacting devices are provided by device pads on the die, which make contact with a carrier package. ESD circuits are typically provided to form an electric path from input/output pads of a die to a ground pad on the die or to a power or bias voltage path for the die. This electrical path is designed to be activated by a high voltage (such as an electrostatic discharge) that is applied to the input or output pads of the die. Most typically, ESD circuits are provided between input/output pads on an unpackaged die and the transistor gates to which the pads are electrically connected.

Conventional ESD protection circuits are frequently formed using impurity implants for the creation of the ESD device. Numerous methods are available, using N-type and P-type implants, to create ESD devices. One such method is provided by U.S. Pat. No. 5,953,601, which is for purposes of reference briefly highlighted at this time. This method is specifically provided for the technology of device feature size of 0.35 µm or less and provides for simultaneously creating FET devices and ESD protection circuits on the surface of a substrate. In forming the ESD source and drain regions, the conventional implantation species is changed from phosphorous to boron, thereby reducing the junction breakdown voltage. Ion implantation is then judiciously performed in areas that have high leakage currents and high parasitic capacitance. These ion implantations assure reduced breakdown voltages, as well as reduced leakage currents and reduced parasitic capacitances of the affected junctions. In addition, ion implantation is performed using a photoresist mask for the formation of silicidation over the contact surfaces. This avoids the problem of silicide degradation and the concomitant increase of contact resistance caused by the moving of metal ions into depletion regions of the junctions during high-energy ESD implantation.

The invention provides a method that negates the need for impurity implantation in order to create an ESD protection device. The invention teaches a special process flow and further provides for a leakage path, created by a contact etch, for the ESD protection function.

U.S. Pat. No. 5,618,740 (Huang) shows a CMOS with enhanced ESD resistance having a contact etch process.

U.S. Pat. No. 6,258,672 (Shih et al.) shows a method for an ESD device.

U.S. Pat. No. 5,891,792 (Shih et al.) and U.S. Pat. No. 5,953,601 (Shiue et al.) reveals other ESD processes.

SUMMARY OF THE INVENTION

A principle objective of the invention is to provide an ESD protection circuit that is simple and cost-effective to create.

Another objective of the invention is to provide an ESD protection circuit that is created without the need for special impurity implantations.

Yet another objective of the invention is to provide an ESD protection circuit that uses a leakage path, created using a contact etch, for the ESD protection function.

In accordance with the objectives of the invention a new process is provided for the creation of an ESD protection circuit. The invention starts with a semiconductor substrate in or on the surface of which have been created a first conventional gate electrode and a second gate electrode that is designated as being the gate electrode that provides the ESD protection function. Source/drain implants have been provided for the gate electrodes, gate spacers have been formed on sidewalls of the gate electrodes, the gate electrodes are electrically isolated. The contact surfaces of the first and second gate electrode are salicided, an etch stop layer is deposited which serves as an etch stop for the creation of contact openings to the contact surfaces of the second gate electrodes. The etch stop layer is removed from the surface of the source/drain regions of the second (that is the ESD) gate electrode. A layer of dielectric is deposited over the first and the second gate electrodes, contact openings are created through the layer of dielectric to the source/drain contact surfaces of the first and second gate electrodes. Significantly, an overetch into the source/drain regions of the second (the ESD) gate electrode occurs during this contact etch. The contact openings are filled with a metal, this metal forms metal plugs to the surface of the source/drain regions of the first gate electrode and into the source/drain regions of the ESD gate electrode. The contact plugs into the source/drain regions of the ESD gate electrode provide a low-resistivity leakage path from the contact plug through the source/drain regions into the substrate on the surface of which the gate electrodes have been created. This low-resistivity leakage path is the ESD protection path of the invention.

BRIEF DESCRIPTION OF THE DRAWINGS

FIG. 8 shows a cross section of one of the contact plugs to the source/drain regions of the ESD gate electrode, highlighting the low-resistivity leakage path that is provided through this contact plug. The leakage path provides the ESD protection function.

DESCRIPTION OF THE PREFERRED EMBODIMENTS

Figure 1:
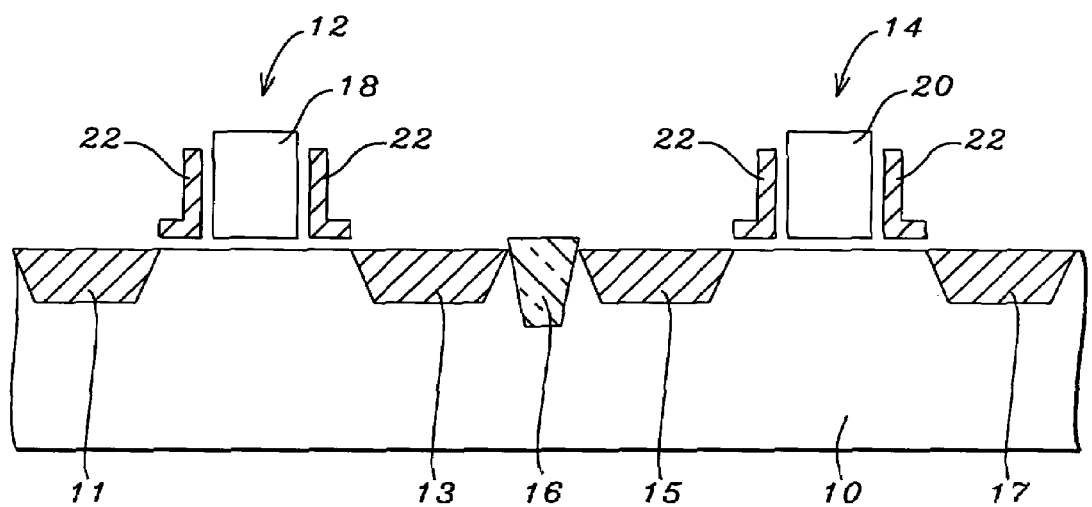
FIG. 1 shows a cross section of a semiconductor substrate on the surface of which two gate electrodes have been formed. A first or left-most gate electrode is a conventional gate electrode, a second or right-most gate electrode is a gate electrode that has been designated as being the gate electrode that is to provide a ESD protection function.

Using typical ESD protection circuits, these circuits can functionally be divided into ESD detection circuits and ESD clamp circuits. The input pad to the ESD protection circuits can be connected to the IC and to the ESD protection circuit. At the time that the ESD disturbance occurs on the input pad, the ESD clamp device is forced into avalanche breakdown causing the ESD clamp circuits to conduct heavily thereby dissipating the electrostatic charge of the ESD source.

The ESD clamp circuit can be a gate grounded NMOS device having its source and bulk connected to the substrate biasing source (VSS), which may be an independent negative voltage or a ground reference point. The drain of the NMOS device is connected to the input pad of the ESD protection circuit. With this kind of a device arrangement, the NMOS device must be created with relatively large device dimensions in order to be able to effectively handle the ESD overcharge without incurring device damage. Such a device is therefore typically created using multiple fingered polysilicon gates. However, despite this robust design the NMOS device can typically sustain only a relatively low ESD voltage. This is caused by the fact that multiple heavily doped polysilicon gates cannot uniformly turn-on so that the gates that achieve earliest turn-on carry most of the avalanche discharge current and are prone to device damage (the current density in the devices that are turned-on is excessive). To achieve uniform gate turn-on, gate driven ESD clamp circuits have been designed. These circuits improve the tolerance of the MOS device to the extreme voltage levels that can occur on ESD sources. For a gate driven ESD clamp circuit, this circuit is used in conjunction with an ESD detection circuit. In the presence of an ESD condition, the ESD detection circuit is uniformly turned on. The ESD detection circuit can be as simple an arrangement as an RC combination with the capacitor connected between the input pad of the ESD protection circuit and the gate of the ESD clamp circuit while the resistor is connected between the gate of the ESD clamp circuit and ground or a low voltage reference. The voltage that is induced by the ESD disturbance at the juncture of the capacitor and resistor, a voltage that is coupled to the gate of the ESD clamp circuit, turns-on the ESD clamp circuit while this voltage can remain at a certain level for a longer period of time due to the RC constant of the components that shape this voltage.

The MOS device that is applied in the ESD clamp circuit can be a NMOS or a PMOS, the circuit configuration for an NMOS device has been indicated above. If a PMOS device is used, the ESD detection circuit is essentially the same as that used for a NMOS ESD clamp circuit. Using a PMOS device for the ESD clamp, the bulk and the drain of the PMOS device are connected to the high voltage (which is also the potential source of an ESD disturbance) while the source is connected to the low or reference voltage (possibly ground). Combined circuit arrangements have been used whereby both a NMOS and a PMOS device are used and connected as previously indicated.

It will be noted in the following description of the invention, that the ESD protection method that is provided by the invention is considerably more simple and therefore considerably more cost effective than conventional methods of providing ESD protection capabilities. The invention provides a low-resistivity leakage path through which accumulated ESD voltage can be conducted to the substrate of the device.

Referring now to the cross section of FIG. 1, there are shown partially completed gate electrodes, the elements that are highlighted in FIG. 1 are the following:

10, the surface of a semiconductor substrate in or on the surface of which the ESD function of the invention is to be created

12, a conventional gate electrode that is shown as a comparative structure to the structure that provides the ESD protection function

14, a gate electrode that provides the ESD protection function

11, 13, 15 and 17, respectively the source and drain regions of respectively the gate electrodes 12 and 14

16, the isolation region in the surface of substrate 10 that electrically separates the gate electrode 12 from the gate electrode 14

18, the body of the gate electrode 12

20, the body of the gate electrode 14

22, gate spacers that have been formed over the sidewalls of gate electrodes 12 and 14.

All of the above highlighted elements are conventional elements that are well known in the art of creating MOSFET gate electrodes. Since none of these elements that are shown in cross section in FIG. 1 are of a special nature, the enumeration of the materials used and the processing conditions applied for the creation of these elements does not contribute to an explanation of the invention and will for this reason not be performed as part of the explanation of the invention.

Figure 2:
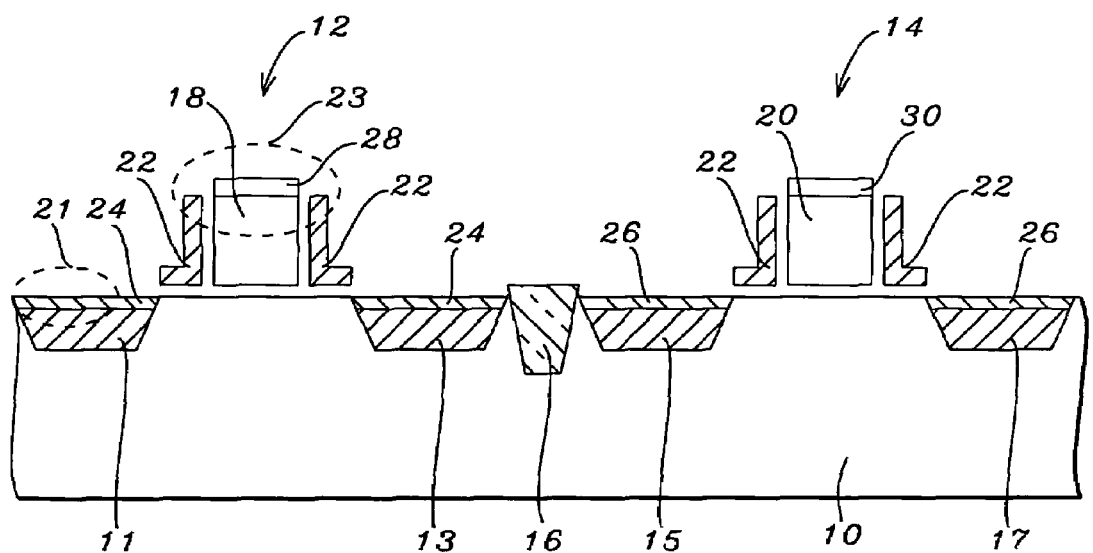
FIG. 2 shows a cross section after the contact regions of the gate electrode have been salicided.

The cross section that is shown in FIG. 2 shows the results of creating a low-resistivity contact surface over the contact regions of the gate electrodes 12 and 14. The contact regions are the surface of the source/drain regions of the gate electrodes and the surface of the body of the gate electrode. Two of these salicided regions are highlighted as regions 21 and 23, 21 referring to the salicided surface 24 of the source region 11 of gate electrode 12, 23 referring to the salicided surface 28 of the body 18 of gate electrode 12. Further highlighted in the cross section of FIG. 2 are the salicided surface regions 24, of the drain region 13 of gate electrode 12, 26, of the source/drain regions 15/17 of gate electrode 14 and 30, of the body of the gate electrode 14.

The process of salicidation is frequently applied in the art and is well known. The preferred method of the invention is to form cobalt based layers of salicided metal over the contact regions of the gate electrodes 12 and 14.

Figure 3:
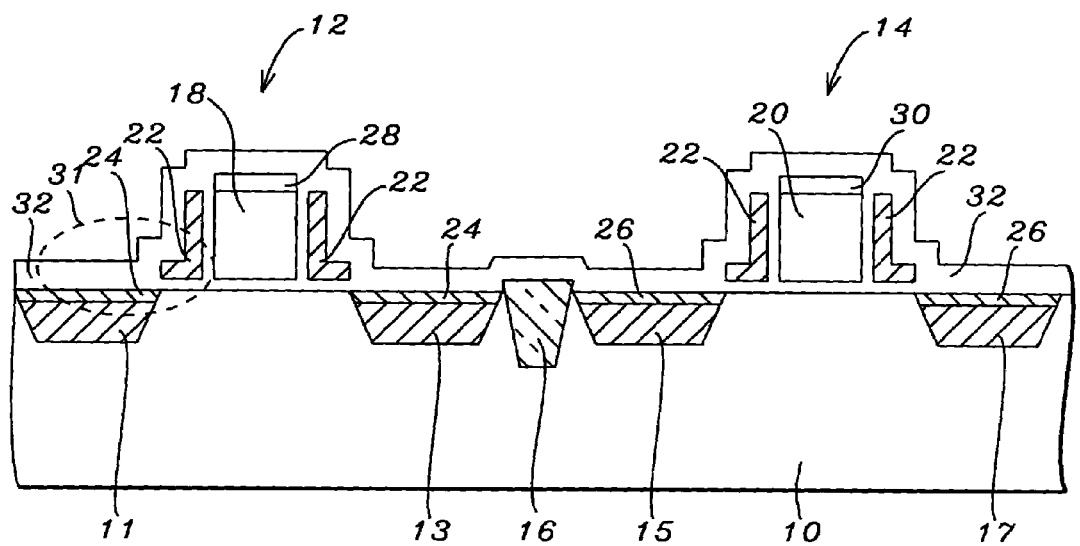
FIG. 3 shows a cross section after an etch stop layer has been deposited over the structure.

Proceeding with the cross section that is shown in FIG. 3, this cross section shows the results of the deposition of an etch stop layer 32 over the surface of the structure. That is the exposed surfaces of the gate electrodes 12 and 14 and the exposed surface of the substrate 10, including the exposed surface of salicided regions 24 and 26. The deposition of etch stop layer 32 is, for purposes of clarity, highlighted adjacent to electrode 12 as deposition 31.

The preferred material of the invention for the creation of etch stop layer 32 is Silicon Oxynitride (SiON). Layer 32 of SiON typically has as formula $SiO_xN_y(H_z)$. Silicon Oxynitrides are formed by creating $SiH_4$ with $N_2O$ and $NH_3$. In order to form a non-conformal layer of SiON, a practical application uses $SiO_xN_y$ deposited by PECVD with a gas flow between about 1700 and 2300 sccm of He, a gas flow of between about 80 and 120 sccm of $N_2O$, a gas flow of between about 40 and 200 sccm of $SiH_4$, at a temperature of between about 380 and 480 degrees C. and at a pressure between about 5 and 8 Torr. A typical carrier gas for the formation of a layer of $SiO_xN_y$ is N2 or He. Layer 32 is preferably deposited to a thickness between about between about 800 and 2,000 Angstrom.

Figure 4:
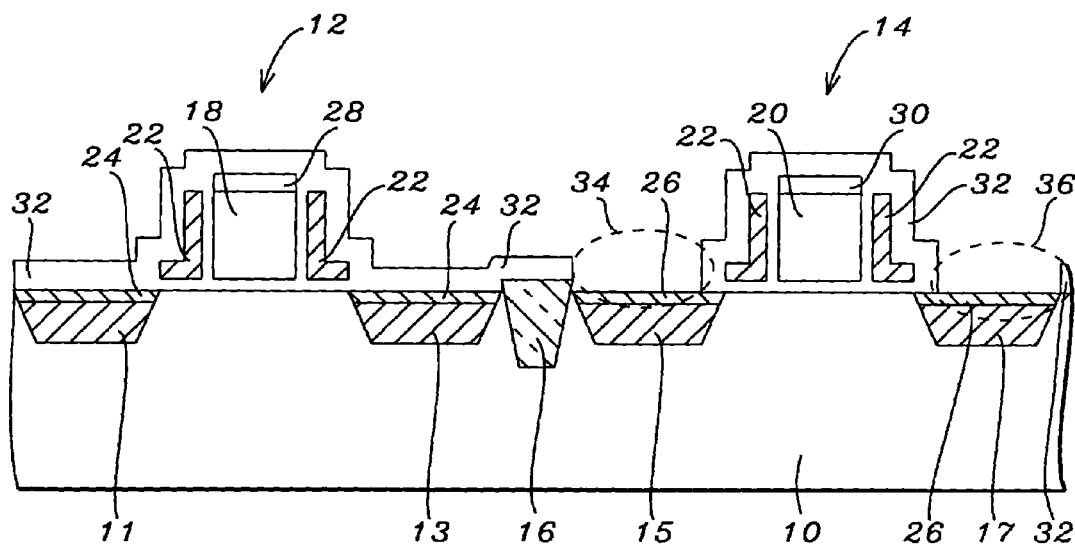
FIG. 4 shows a cross section after the etch stop layer has been removed from above the source/drain surface regions of the ESD gate electrode.

The invention continues with creating openings through the layer 32 that align with the source/drain regions 15/17 of gate electrode 14. This etch has been shown in the cross section of FIG. 4 as regions 34 and 36 respectively. For this etch, conventional methods of photolithography are applied, creating a mask of photoresist that exposes the surface of salicided surface regions 24 of gate electrode 14.

Layer 32 of SiON can be etched by exposing layer 32 to a recipe comprising $O_2$, at a flow rate between 10 and 100 sccm, and $N_2$, at a flow rate between 10 and 100 sccm, for a period between about 30 and 60 seconds. The preferred method of the invention for the etch of layer 32 comprises applying a dry etch or a wet etch process.

Figure 5:
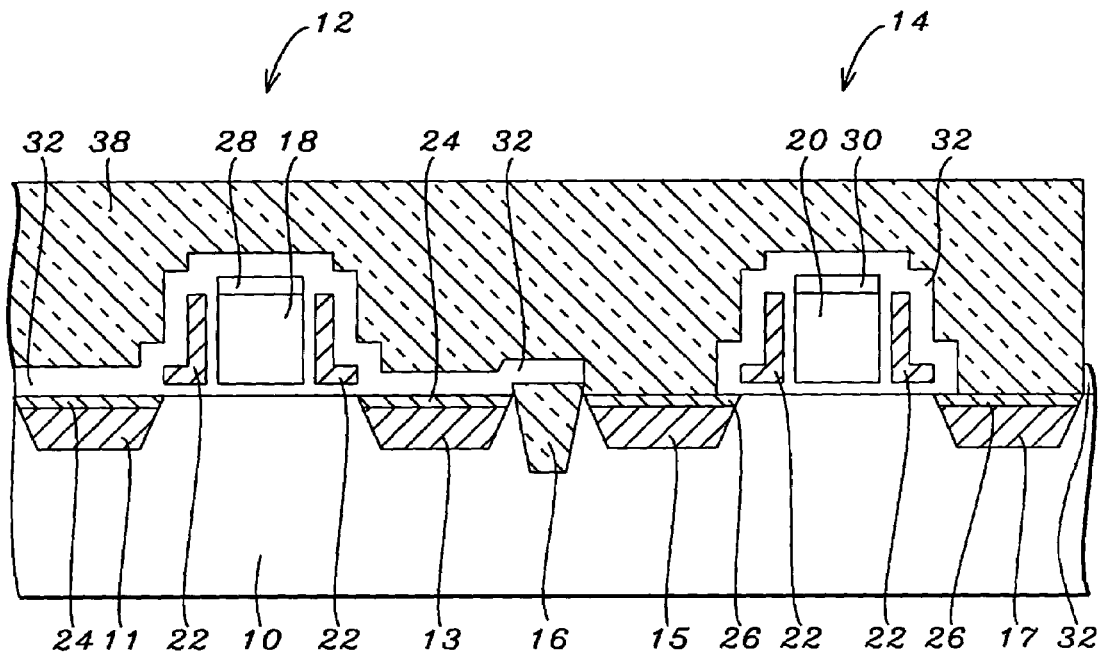
FIG. 5 shows a cross section after a layer of dielectric has been deposited over the structure.

A blanket layer 38 of dielectric, preferable comprising boro-phosphate-silicate-glass (BPSG), is next deposited over the surface as shown in cross section in FIG. 5. Re-flow is applied to the layer 38 of BPSG after deposition, BPSG flows at relatively low temperatures of between about 800 and 850 degrees C. at atmospheric pressure.

BPSG is frequently used as a dielectric material for creating an inherently planar surface. BPSG can be formed as a spin-on material that can be cured after it has been deposited on a surface. BPSG can also be formed within a Chemical Vapor Deposition (CVD) chamber, often used with a plasma enhanced or plasma assisted environment. By heating the deposited BPSG (after it has been deposited) to a temperature of about 800 to 850 degrees C., the BPSG can be made to reflow thereby creating a surface of good planarity. A time difference or lag, in the order of several (that is two) hours or more, may be required between the deposition of the layer of BPSG and the re-flow of the deposited BPSG.

The flow of BPSG depends on film composition, flow temperatures, flow time and the flow ambient environment. The film composition can be altered by increasing for instance the boron concentration of 1 wt % in BPSG, this decreases the BPSG flow temperature by 40 degrees C. However, by increasing the phosphorous content by about 5 wt % in the BPSG, no decrease in flow temperature is achieved. By further increasing the boron concentration of the BPSG film, this film becomes unstable and hydroscopic resulting in the requirement that the BPSG must be flowed immediately after it has been deposited.

BPSG further has the desirable property of acting as an alkali ion getter and of forming a low stress surface. Care must be taken that the doping limit of BPSG does not exceed certain limits since BPSG can in that case become the source of unwanted diffusion to the underlying silicon. It has been found that BPSG is primarily a source of phosphorous and that the phosphorous out-diffusion increases with increased level of boron.

BPSG is further used for sidewall contouring of contact holes by reflow. In addition to assuring that the contact holes are opened and that silicon-surface damage and contamination are minimized, it is also important to give the contact holes a shape that will result in good step coverage by the metal that is deposited into it. In general, better step coverage will be obtained if the walls of the openings are sloped and the top corners are rounded.

The layer 38 of BPSG is, after deposition and re-flow, preferably polished applying methods of Chemical Mechanical Polishing (CMP) for improved planarity of the surface of layer 38.

Figure 6:
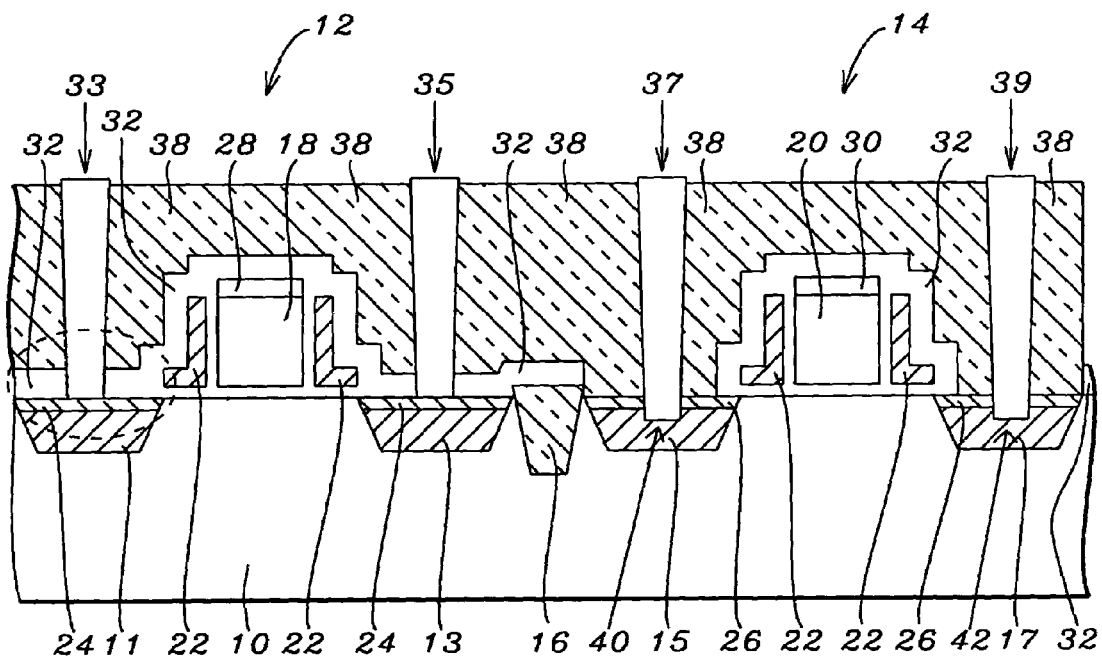
FIG. 6 shows a cross section after contact openings to the source/drain regions of the gate electrodes have been created through the layer of dielectric, further resulting in an overetch into the source/drain regions of the ESD gate electrode.

The invention continues, FIG. 6, with etching contact holes to the source/drain surface regions of gate electrodes 12 and 14 using conventional methods of photolithography and etch. Created in this manner are openings 33, 35, 37 and 39. Openings 33 and 35 expose the surfaces 24 of salicided source/drain regions 11/13 of gate electrode 12. Openings 37 and 39 expose and etch through the surfaces 26 of salicided source/drain regions 15/17 of gate electrode 14. By etching through the salicided surfaces 26 of the source/drain regions 15/17 of gate electrode 14, the contact openings 37 and 39 create a direct access to the source/drain regions 15/17 of ESD gate electrode 14.

Specially highlighted in the cross section of FIG. 6 are regions 40 and 42 where the etch that creates openings 33, 35, 37 and 39 through the layer 38 of BPSG has etched through salicided layer 26 of gate electrode 14 and into the source/drain regions 15/17 of this gate electrode 14. It is clear that the level of the impurity implantation of the source/drain regions 15/17 determines the conductivity of these regions to the underlying silicon substrate 10. This level of impurity implants therefore determines the resistivity of the conductive path that is created through the source/drain regions to the underlying substrate 10.

For the etching of layer 38 of BPSG either $CF_4$ or $CHF_3$ or $C_3F_8$ or $C_2H_6$ or $SF_6$ or combinations thereof may be used at etching gasses with dilutants such as Argon or Helium, at a pressure between about 10 to 150 mTorr and a rf power between about 100 and 1500 Watts.

Figure 7:
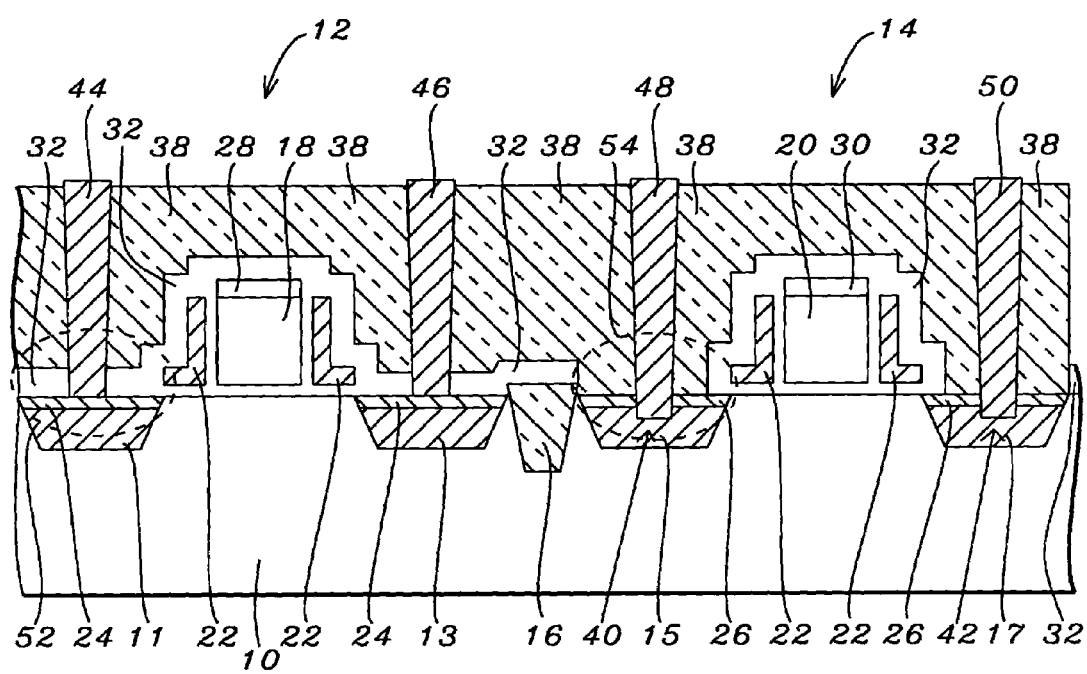
FIG. 7 shows a cross section after the contact openings have been filled with a conductive material.

The cross section of FIG. 7 shows how the openings 33, 35, 37 and 39 have been filled with a conductive material, preferably tungsten, creating contact plugs 44, 46, 48 and 50 to the source/drain regions of gate electrodes 12 and 14. The deposited layer of tungsten (not shown) is blanket deposited over the surface of layer 38 of BPSG using methods of metal deposition such as metal sputtering and the like, filling the openings created through this layer. After this layer of tungsten has been deposited, the layer is polished using methods of CMP essentially down to the surface of the layer 38 of BPSG, leaving tungsten plugs 44, 46, 46 and 48 in place inside openings 33, 35, 37 and 39.

Specially highlighted in the cross section of FIG. 7 are areas 52 and 54. Area 52 highlights a contact plug 44 that makes contact with the salicided surface 24 of the source region 11 of gate electrode 12. This is a conventional method of contacting the source region of a gate electrode. Area 54 highlights a contact plug 48 that passes through the salicided surface 26 of the source region 15 of gate electrode 14 and that further penetrates into the source region 15 of gate electrode 14. This therefore forms a low-resistivity conductive path that can be used as an ESD protective path. The same comment applies to the contact plug 50 to the drain region 17 of gate electrode 14.

The cross section that is shown in FIG. 8 shows essentially now familiar elements of the structure in addition to the leakage current 56 that flows from conductive plug 48/50 through the source/drain region 15/17 to the underlying substrate (not shown) 10.

The invention has provided for an efficient, controllable (by means of controlling the level of impurity implantation into the source/drain regions of the ESD gate electrode), cost-effective and manufacturable method of providing an ESD protection capability. The methods and processes that are applied by the invention for this purpose are readily available in a semiconductor manufacturing facility, making the invention easy to integrate using standard semiconductor manufacturing facilities.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for providing Electronic Discharge (ESD) protection capabilities, comprising the steps of:
    providing a substrate having a structure thereon, said structure comprising at least one gate electrode and source and drain regions extending into said substrate, said structure adapted to be provided with ESD protection; and
    providing at least one conductive interconnect over said substrate, said at least one conductive interconnect penetrating into said source region or said drain region to a depth that is below a surface of said source or drain region to provide a path for electron leakage.

2. The method of claim 1, said providing at least one conductive interconnect over said substrate comprising the steps of:
    saliciding contact surfaces of said at least one gate electrode;
    depositing an etch stop layer over said substrate, including exposed surfaces of said at least one gate electrode;
    removing said etch stop layer from said source and drain regions;
    depositing a layer dielectric over said substrate, including exposed surfaces of said at least one gate electrode;
    patterning said layer of dielectric, said patterning creating openings aligned with said source and drain regions, said openings further penetrating through the surface of said source and drain regions, said openings penetrating into said source or drain region to a depth that is below said surface of said source or drain region;
    filling said openings with a conductive material, creating conductive interconnects in said openings, said conductive interconnects providing low-resistivity paths through said layer of dielectric to said substrate, said low-resistivity conductive paths providing ESD protection capabilities.

3. The method of claim 2, said saliciding contact surfaces of said at least gate electrode comprising forming cobalt based surfaces over said contact surfaces.

4. The method of claim 2, said contact surface comprising said source and drain regions in addition to the top surface of said at least one gate electrode.

5. The method of claim 2, said etch stop layer comprising Silicon Oxynitride (SiON).

6. The method of claim 2, said removing said etch stop layer from said source and drain regions comprising exposing said etch stop layer to an etch recipe comprising $O_2$, at a flow rate between 10 and 100 sccm, and $N_2$, at a flow rate between 10 and 100 sccm, for a period between about 30 and 60 seconds.

7. The method of claim 2, said removing said etch stop layer from said source and drain regions comprising applying a dry etch or a wet etch process.

8. The method of claim 2, said layer of dielectric comprising boro-phosphate-silicate-glass (BPSG).

9. The method of claim 2, said patterning said layer of dielectric comprising applying an etchant gas selected from the group consisting of $CF_4$ and $CHF_3$ and $C_3F_8$ and $C_2H_6$ and $SF_6$ and combination thereof.

10. The method of claim 9, said etchant gas being applied using a dilutant gas selected from the group consisting of Argon and Helium.

11. The method of claim 9, said etchant gas being applied at a pressure between about 10 to 150 mTorr and a radio frequency power between about 100 and 1500 Watts.

12. The method of claim 2, said patterning said layer of dielectric comprising applying an etchant gas selected from the group consisting of $CF_4$ and $CHF_3$ and $C_3F_8$ and $C_2H_6$ and $SF_6$ and combination thereof, applied using a dilutant gas selected from the group consisting of Argon and Helium at a pressure between about 10 to 150 mTorr and a radio frequency power between about 100 and 1500 Watts.

13. The method of claim 2 with an additional step of polishing said deposited layer of dielectric, and additional step being performed prior to said step of patterning said layer of dielectric.

14. The method of claim 13, said polishing said deposited layer of dielectric comprising Chemical Mechanical Polishing (CMP).

15. The method of claim 2 with an additional step of reflowing said layer of dielectric, said re-flow being performed prior to said step of patterning said layer of dielectric.

16. The method of claim 15, a time difference or lag being imposed between the deposition of the layer of dielectric and the re-flow of the deposited dielectric.

17. The method of claim 16, said time lag being at least two hours.

18. The method of claim 2 with additional steps being performed prior to said step of patterning said layer of dielectric, said additional steps comprising:
    reflowing said layer of dielectric; and then
    polishing said deposited layer of dielectric.

19. The method of claim 18, said polishing said deposited layer of dielectric comprising Chemical Mechanical Polishing (CMP).

20. The method of claim 18, a time difference of lag being imposed between the deposition of the layer of dielectric and the re-flow of the deposited dielectric.

21. The method of claim 20, said time difference or lag being at least two hours.

22. The method of claim 2 with additional steps being performed prior to said step of patterning said layer of dielectric, said additional steps comprising:
    reflowing said layer of dielectric, a time difference or lag being imposed between the deposition of the layer of dielectric and the re-flow of the deposited dielectric; and then
    polishing said deposited layer of dielectric.

23. The method of claim 22, said polishing said deposited layer of dielectric comprising Chemical Mechanical Polishing (CMP).

24. The method of claim 22, said time difference or lag being at least two hours.

25. The method of claim 2 with additional steps being performed prior to said step of patterning said layer of dielectric, said additional steps comprising:
reflowing said layer of dielectric, a time difference or lag being imposed between the deposition of the layer of dielectric and the re-flow of the deposited dielectric, said time of difference of lag being at least two hours; and then
polishing said deposited layer of dielectric.

26. The method of claim 25, said polishing said deposited layer of dielectric comprising Chemical Mechanical Polishing (CMP).

27. The method of claim 2 with additional steps being performed prior to said step of patterning layer of dielectric, said additional steps comprising:
reflowing said layer of dielectric, a time difference or lag being imposed between the deposition of the layer of BPSG and the re-flow of the deposited BPSG, said time difference or lag being at least two hours; and then
polishing said deposited layer of dielectric by applying methods of Chemical Mechanical Polishing (CMP).

28. The method of claim 1, gate spacers having been provided on sidewalls of said at least one gate electrode, said at least one gate electrode being electrically isolated from said substrate.

29. An Electronic Discharge (ESD) structure as part of a gate electrode structure, comprising:
a substrate having a structure thereon, said structure comprising at least one gate electrode and source and drain regions extending into said substrate, said structure adapted to be provided with ESD protection; and
at least one conductive interconnect having been provided over said substrate, said at least one conductive interconnect penetrating into said source region or said drain region to a depth that is below a surface of said source or drain to provide a path for electron leakage.

30. The structure of claim 29, said at least one conductive interconnect comprising salicided contact surfaces.

31. The structure of claim 30, said salicided contact surfaces comprising cobalt.

32. The structure of claim 30, said contact surfaces comprising said source and drain regions in addition to the top surface of said at least one gate electrode.

33. The structure of claim 29, gate spacers having been provided on sidewalls of said at least one gate electrode, at least one gate electrode being electrically isolated from said substrate.

34. A method for providing Electronic Discharge protection capabilities, comprising the steps of:
providing a substrate having a first structure and a second structure thereon, said first structure comprising at least one first gate electrode and first source and drain regions formed into said substrate and said second structure comprising at least one second gate electrode and second source and drain regions formed into said substrate, said first structure adapted to be provided with ESD protection, gate spacers on sidewalls of said at least one first and at least one second gate electrodes, said at least one first gate electrode and said at least one second gate electrode being electrically isolated from said substrate;
saliciding contact surfaces of said at least one first and said at least one second gate electrodes;
depositing an etch stop layer over said substrate, including exposed surfaces of said at least one first and said at least one second gate electrodes;
removing said etch stop layer from said first source and drain regions;
depositing a layer of dielectric over said substrate, including exposed surfaces of said at least one first and said at least one second gate electrodes;
patterning said layer of dielectric, said patterning creating openings aligned with the salicided surface of said first and second source and drain regions, said openings exposing said source and drain regions, said openings further penetrating through the surface of said first source and drain regions to a depth that is below a surface of said first source or drain region;
filling said openings with a conductive material, creating conductive interconnects in said openings to said first and second source and said drain regions, said conductive interconnects provided to said first source and said drain regions providing low-resistivity paths through said layer of dielectric to said substrate, said low-resistivity conductive paths providing a path for electron leakage.

35. The method of claim 34, said saliciding contact surfaces of said at least one first gate electrode and said at least one second gate electrode comprising forming cobalt based surfaces over said contact surfaces.

36. The method of claim 34, said contact surfaces comprising the surfaces of said first and second source and drain regions in addition to the top surface of said at least one first gate electrode and said at least one second gate electrode.

37. The method of claim 34, said etch stop layer comprising Silicon Oxynitride (SiON).

38. The method of claim 34, said removing said etch stop layer from said first source and drain regions comprising exposing said etch stop layer to a recipe comprising $O_2$, at a flow rate between 10 and 100 sccm, and $N_2$, at a flow rate between 10 and 100 sccm, for a period between about 30 and 60 seconds.

39. The method of claim 34, said removing said etch stop layer from said first source and drain regions comprising applying a dry etch or a wet etch process.

40. The method of claim 34, said layer of dielectric comprising boro-phosphonic-silicate-glass (BPSG).

41. The method of claim 40 with additional steps being performed prior to said of patterning said layer of dielectric, said additional steps comprising:
reflowing said layer of dielectric, a time difference or lag being imposed between the deposition of the layer of dielectric and the re-flow of the deposited BPSG, said time difference or lag being at least two hours; and then
polishing said deposited layer of dielectric.

42. The method of claim 41, said polishing said deposited layer of dielectric comprising Chemical Mechanical Polishing (CMP).

43. The method of claim 34, said patterning said layer of dielectric comprising applying an etchant gas selected from the group consisting of $CF_4$ and $CHF_3$ and $C_3F_8$ and $C_2H_6$ and $SF_6$ and combinations thereof.

44. The method of claim 43, said etchant gas being applied using a dilutant gas selected from the group consisting of Argon and Helium.

45. The method of claim 43, said etchant gas being applied at a pressure between about 10 to 150 mTorr and a radio frequency power between about 100 and 1500 Watts.

46. The method of claim 34, said patterning said layer of dielectric comprising applying an etchant gas selected from the group consisting of $CF_4$ and $CHF_3$ and $C_3F_8$ and $C_2H_6$ and $SF_6$ and combinations thereof, applied using a dilutant gas selected from the group consisting of Argon and Helium at a pressure between about 10 to 150 mTorr and a radio frequency power between about 100 and 1500 Watts.

47. The method of claim 34 with an additional step of polishing said deposited layer of dielectric, said additional step being performed prior to said step of patterning said layer of dielectric.

48. The method of claim 47, said polishing said deposited layer of dielectric comprising Chemical Mechanical Polishing (CMP).

49. The method of claim 34 with an additional step of reflowing said layer dielectric, said re-flow being performed prior to said step of patterning said layer of dielectric.

50. The method of claim 49, a time difference of lag being imposed between the deposition of the layer of dielectric and the re-flow of the deposited dielectric.

51. The method of claim 50, said time lag being at least two hours.

52. The method of claim 34 with additional steps being performed prior to said step of patterning said layer of dielectric, said additional steps comprising:
   reflowing said layer of dielectric; and then
   polishing said deposited layer of dielectric.

53. The method of claim 52, said polishing said deposited layer of dielectric comprising Chemical Mechanical Polishing (CMP).

54. The method of claim 52, a time difference of lag being imposed between the deposition of the layer of dielectric and the re-flow of the deposited dielectric.

55. The method of claim 54 said time difference or lag being at least two hours.

56. The method of claim 34 with additional steps being performed prior to said step of patterning said layer of dielectric, said additional steps comprising;
   reflowing said layer of dielectric, a time difference or lag being imposed between the deposition of the layer of dielectric and the re-flow of the deposited dielectric; and then
   polishing said deposited layer of dielectric.

57. The method of claim 56, said polishing said deposited layer of dielectric comprising Chemical Mechanical Polishing (CMP).

58. The method of claim 56, said time difference or lag being at least two hours.

59. The method of claim 34 with additional steps being performed prior to said step of patterning said layer of dielectric, said additional steps comprising:
   reflowing said layer of dielectric, a time difference or lag being imposed between the deposition of the layer of dielectric and the re-flow of the deposited dielectric, said time difference or lag being at least two hours; and then
   polishing said deposited layer of dielectric by applying Chemical Mechanical Polishing (CMP).

* * * * *